US011206039B1

(12) United States Patent
Ebihara

(10) Patent No.: US 11,206,039 B1
(45) Date of Patent: Dec. 21, 2021

(54) COMPARATOR STAGE WITH DC CUT DEVICE FOR SINGLE SLOPE ANALOG TO DIGITAL CONVERTER

(71) Applicant: OMNIVISION TECHNOLOGIES, INC., Santa Clara, CA (US)

(72) Inventor: Hiroaki Ebihara, San Jose, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 0 days.

(21) Appl. No.: 17/127,499

(22) Filed: Dec. 18, 2020

(51) Int. Cl.
| | |
|---|---|
| *H03M 1/56* | (2006.01) |
| *H03K 5/08* | (2006.01) |
| *H04N 5/3745* | (2011.01) |
| *H03M 1/46* | (2006.01) |
| *H03K 5/24* | (2006.01) |

(52) U.S. Cl.
CPC ............... *H03M 1/56* (2013.01); *H03K 5/08* (2013.01); *H03K 5/2481* (2013.01); *H03M 1/466* (2013.01); *H04N 5/37455* (2013.01)

(58) Field of Classification Search
CPC .... H03M 1/56; H03M 1/466; H04N 5/37455; H03K 5/08; H03K 5/248

USPC .................................................. 341/155, 169
See application file for complete search history.

(56) References Cited

U.S. PATENT DOCUMENTS

| | | | |
|---|---|---|---|
| 8,749,424 B2 | 6/2014 | Ueno | |
| 9,143,119 B2 * | 9/2015 | Sohn .................... | H03K 5/2481 |
| 9,967,505 B1 | 5/2018 | Ebihara | |
| 9,985,622 B2 * | 5/2018 | Tanaka ................. | H03K 5/2481 |
| 10,079,990 B2 | 9/2018 | Ebihara et al. | |
| 10,498,322 B1 | 12/2019 | Ebihara | |

* cited by examiner

*Primary Examiner* — Khai M Nguyen
(74) *Attorney, Agent, or Firm* — Christensen O'Connor Johnson Kindness PLLC

(57) ABSTRACT

A comparator includes a second stage coupled between a first stage and a third stage. The second stage includes a first transistor coupled to be switched in response to a first output signal coupled to be received from the first stage. The first transistor is coupled generate a second output signal coupled to be received by the third stage. A second transistor is coupled to the first transistor. The first and second transistors are coupled between a first supply voltage and a reference voltage. A second stage current of the second stage is conducted through the first transistor and the second transistor. The second transistor is coupled to be switched in response to a third output signal coupled to be received from the third stage in response to the second output signal.

28 Claims, 12 Drawing Sheets

US 11,206,039 B1

COMPARATOR STAGE WITH DC CUT DEVICE FOR SINGLE SLOPE ANALOG TO DIGITAL CONVERTER

BACKGROUND INFORMATION

Field of the Disclosure

This disclosure relates generally to image sensors, and in particular but not exclusively, relates to a comparator for use in analog to digital conversion in an image sensor.

Background

Image sensors have become ubiquitous and are now widely used in digital cameras, cellular phones, security cameras, as well as medical, automobile, and other applications. As image sensors are integrated into a broader range of electronic devices, it is desirable to enhance their functionality, performance metrics, and the like in as many ways as possible (e.g., resolution, power consumption, dynamic range, etc.) through both device architecture design as well as image acquisition processing.

A typical image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bitlines that vary as a function of the incident image light. In other words, the amount of image charge generated is proportional to the intensity of the image light, which is read out as analog image signals from the column bitlines and converted to digital values to provide information that is representative of the external scene.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1A:
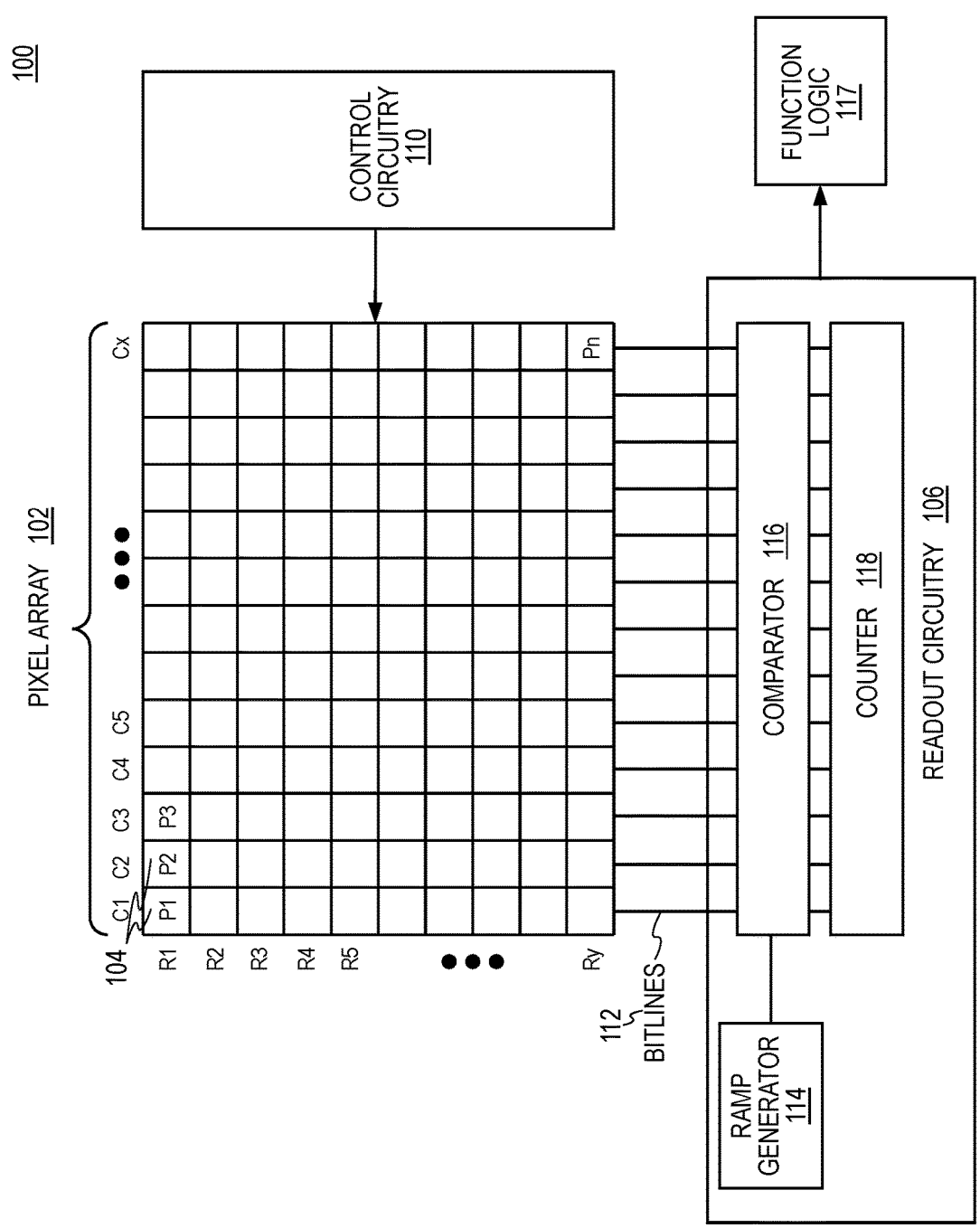
FIG. 1A illustrates one example of an imaging system with readout circuitry including one example of a comparator for use with an analog to digital converter in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

Various examples of an apparatus and system for a comparator including a stage with a DC cut device for use in an image sensor analog to digital converter are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "over," "under," "above," "upper," "top," "bottom," "left," "right," "center," "middle," and the like, may be used herein for ease of description to describe one element or feature's relationship relative to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein are interpreted accordingly. In addition, it will also be understood that when an element is referred to as being "between" two other elements, it can be the only element between the two other elements, or one or more intervening elements may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

FIG. 1A illustrates one example of an imaging system with readout circuitry 106 including one example of a comparator 116 for use with an analog to digital converter in accordance with the teachings of the present invention. As will be discussed, in various examples comparator 116 is a multi-stage comparator having a stage with a DC cut device in accordance with an embodiment of the present disclosure. Imaging system 100 includes pixel array 102, control circuitry 110, readout circuitry 106, and function logic 117. In one example, pixel array 102 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, in other examples, it is appreciated that the photodiodes/pixels do not necessarily have to be arranged into rows and columns and may take other configurations.

In one example, after each image sensor photodiode/pixel in pixel array 102 has acquired its image data or image charge, the image data is read out by readout circuitry 106 and then transferred to function logic 117. Readout circuitry 106 may be coupled to read out image data from the plurality of photodiodes in pixel array 102 through bitlines 112. In various examples, readout circuitry 106 may include amplification circuitry, analog to digital conversion (ADC) circuitry, or otherwise. In some embodiments, a ramp generator 114, one or more comparators 116, and one or more counters 118 may be included for each of the bitlines 112 of the readout columns. As will be discussed in greater detail below, the ramp generator 114, comparators 116, and counters 118 may be utilized in a respective analog to digital converter (ADC) included in the readout circuitry 106 to generate digital representations of the image data. In the example, function logic 117 may be coupled to readout circuitry 106 to simply store the image data or even manipulate the image data by applying post image effects (e.g., crop, rotate, remove red eye, adjust brightness, adjust contrast, or otherwise). In one example, readout circuitry 106 may read out a row of image data at a time along the column bitlines 112 (illustrated) or may read out the image data using a variety of other techniques (not illustrated), such as a serial readout or a full parallel readout of all pixels simultaneously.

In one example, the ADC included in readout circuitry 106 is a single slope ADC. To perform analog to digital conversion, for example, the readout circuitry 106 may receive a ramp signal from ramp generator 114. The ramp signal may be received from the ramp generator 114 by the comparator 116, which may also receive image charge from a pixel of the pixel array 102 through a respective column bitline 112. The comparator 116 may determine a digital representation of the image charge based on a comparison of the ramp signal to the image charge voltage level. In the example, the counter 118 begins counting at the beginning of an analog to digital conversion process as a ramp event begins in the ramp signal from the ramp generator 114. The comparator 116 compares the ramp signal with the image charge voltage level and the output of comparator 116 transitions from a first state to a second state when the ramp signal reaches the input image charge voltage level. In other words, this "flipping point" of the output of comparator 116 occurs when comparator 116 detects when the voltage level of the ramp signal from the ramp generator 114 is equal to the image charge voltage level from the bitline 112, and as a result the output of the comparator 116 flips from a first state (e.g., logic "1") to a second state (e.g., logic "0"), or vice versa, which stops the counter 118 from counting. The counter value from counter 118 can then be read out to determine the digital representation of the image charge voltage level from bitline 112.

In one example, control circuitry 110 is coupled to pixel array 102 to control operation of the plurality of photodiodes in pixel array 102. For example, control circuitry 110 may generate a shutter signal for controlling image acquisition. In one example, the shutter signal is a global shutter signal for simultaneously enabling all pixels within pixel array 102 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 100 may be included in a digital camera, cell phone, laptop computer, or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 1B:
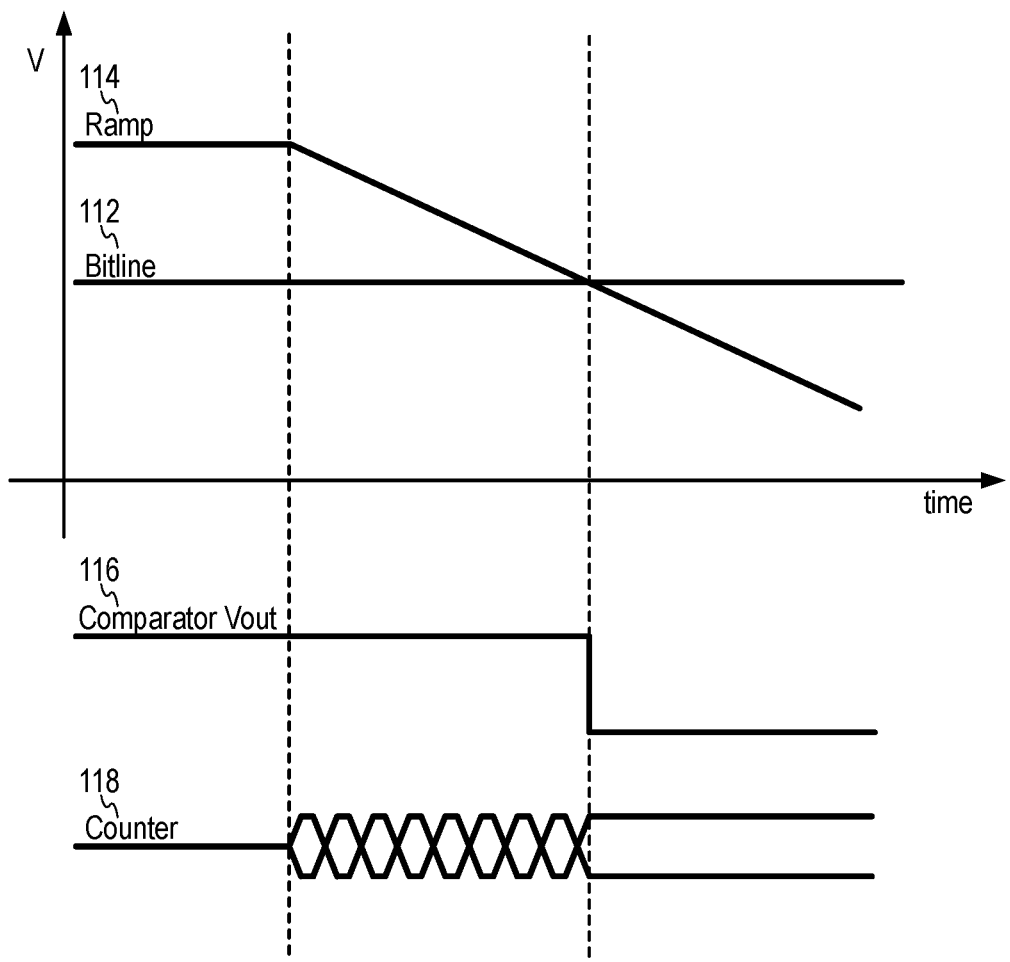
FIG. 1B is a timing diagram that illustrates some of the signals associated with a comparator as illustrated in FIG. 1A during an analog to digital conversion in an image sensor.

FIG. 1B is a timing diagram that illustrates some of the signals associated with ramp generator 114, comparator 116, and counter 118 as illustrated in FIG. 1A during an analog to digital conversion in an image sensor. Specifically, FIG. 1B shows the ramp signal from ramp generator 114, the image charge voltage level from the bitline 112, the output voltage Vout from comparator 116, and the operation of counter 118 with respect to time during a single slope analog to digital conversion. As shown, the ramp event begins in ramp 114 as the ramp signal begins to ramp (e.g., ramp down) as the counter 118 begins counting at the first vertical dashed line in FIG. 1B. At this time, the comparator Vout 116 is in a first state (e.g., logic "high" or "1") while the voltage of ramp signal 114 is greater than the voltage of bitline 112.

Continuing with the example depicted in FIG. 1B, as soon as the ramp 114 is equal to or falls to a value less than the image charge voltage level indicated by the bitline 112, the comparator Vout 116 transitions or "flips" to a second state (e.g., logic "low" or "0") at the second vertical dashed line in FIG. 1B. At this time, the counter 118 stops counting. In the various examples, the value of counter 118 after it has been stopped is read out and used to determine the digital representation of the image charge voltage level from the bitline 112. In various examples, the ramp 114, bitline 112, comparator Vout 116, and counter 118 may then be reset before the next analog to digital conversion begins.

Figure 2A:
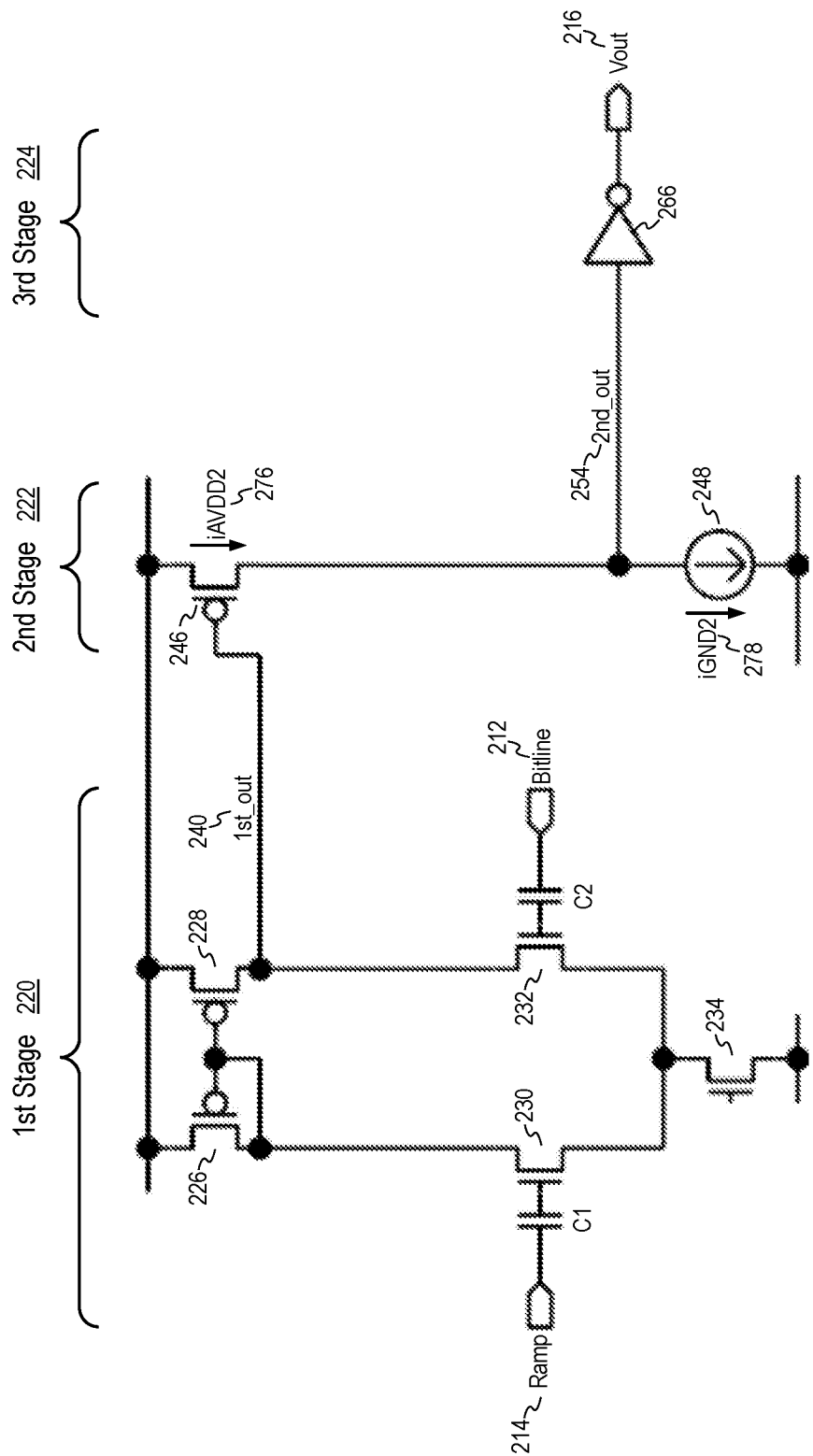
FIG. 2A illustrates a schematic that shows an example of a comparator with multiple stages for use with an analog to digital converter in an image sensor.

FIG. 2A is a schematic that shows an example of a comparator with multiple stages for use with an analog to digital converter in an image sensor. As shown in the example, the comparator includes a first stage 220 coupled to a second stage 222 coupled to a third stage 224. The first stage 220 includes transistor 226, transistor 228, transistor 230, transistor 232, and transistor 234. The sources of transistors 226 and 228 are coupled to a supply voltage. The gates of transistors 226 and 228 are coupled together and are coupled to the drain of transistor 226. The drain of transistor 230 is coupled to the drain of transistor 226, and the drain of transistor 232 is coupled to the drain of transistor 228. Transistor 234 is coupled between the sources of transistors 230 and 232 and a reference voltage. The gate of transistor 230 is capacitively coupled to receive ramp 214 through capacitor C1, and the gate of transistor 232 is capacitively coupled to receive bitline 212 through capacitor C2. The drain of transistor 228 is configured to generate 1st_out 240, which is the output of the first stage 220.

The second stage 222 includes a transistor 246 and a current source 248 coupled between the supply voltage and the reference voltage. The gate of transistor 246 is coupled to receive 1st_out 240. The current iAVDD2 276 represents the current through transistor 246 and the current iGND2 278 represents the current through current source 248. The drain of transistor 246 is configured to generate 2nd_out 254, which is the output of the second stage 222. It is appreciated that second stage 222 utilizes a simple common source amplifier as the second stage.

The third stage 224 includes an inverter 266 having an input coupled to receive 2nd_out 254. The output of inverter 266 is the output voltage of the comparator Vout 216.

Figure 2B:
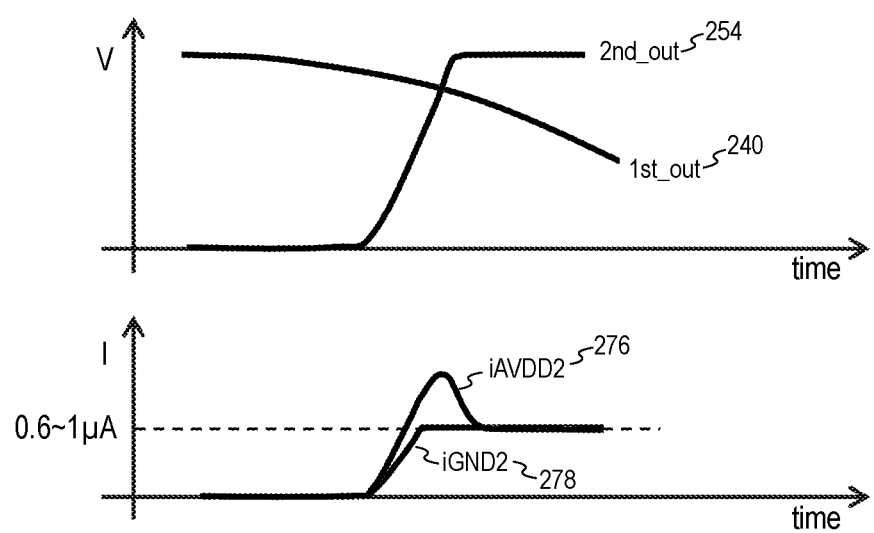
FIG. 2B is a timing diagram that illustrates some of the signals associated with a comparator as illustrated in FIG. 2A during an analog to digital conversion in an image sensor.

FIG. 2B is a timing diagram that illustrates some of the signals associated with the comparator as illustrated in FIG. 2A during an analog to digital conversion in an image sensor. In the example, the comparator is used in a single slope ADC and the comparator is configured to compare the bitline voltage 212 with a ramp 214. FIG. 2B shows an example of the 1st_out 240 voltage, the 2nd_out 254 voltage, the iAVDD2 276 current, and the iGND2 278 current with respect to time during a single slope analog to digital conversion. As shown, the 1st_out 240 voltage is initially a positive value and the 2nd_out 254 voltage, the iAVDD2 276 current, and the iGND2 278 current are substantially zero at the start of the analog to digital conversion.

As shown in the example depicted in FIG. 2B, as 1st_out 240 voltage begins to fall as the comparator begins to transition or "flip" from a first state to a second state, the 2nd_out 254 voltage, the iAVDD2 276 current, and the iGND2 278 current all begin to rise in response. The example further shows that after the comparator has transitioned or "flipped" from the first state to the second state, the 2nd_out 254 voltage plateaus at a positive voltage as shown, and the iAVDD2 276 current, and the iGND2 278 current both settle at a current around 0.6~1 µA.

FIGS. 2A-2B illustrate that one of the disadvantages of the comparator shown in FIG. 2A is that there is a difference in current before and after the comparator has transitioned or "flipped." Specifically, the second stage 222 current, as shown with the iAVDD2 276 and the iGND2 278 currents, is substantially zero at the beginning of the comparison, but changes or increases after second stage 222 transitions states as illustrated. This change in the current of the second stage 222 can cause unwanted H-banding.

In order to reduce the unwanted H-banding caused by the changes in the current of the second stage 222 before and after the transitions in the comparator state as illustrated in FIG. 2B, one solution might be to add an additional current branch to the second stage 222 for current compensation. In such a solution, before the second stage 222 transitions or "flips," the branch of second stage 222 that includes transistor 246 and current source 248 does not consume current while the compensation branch draws current. After the second stage 222 transitions or "flips," the branch of second stage 222 that includes transistor 246 and current source 248 draws current while the compensation branch does not consume current. As such, the DC current conducted through the second stage 222 can be kept substantially unchanged before and after the transitions. However, a disadvantage in this approach is larger overall current consumption because the second stage 222 is always consuming some current through either the compensation branch or the branch with transistor 246 and current source 248 before or after the second stage 222 transitions or "flips."

Figure 3A:
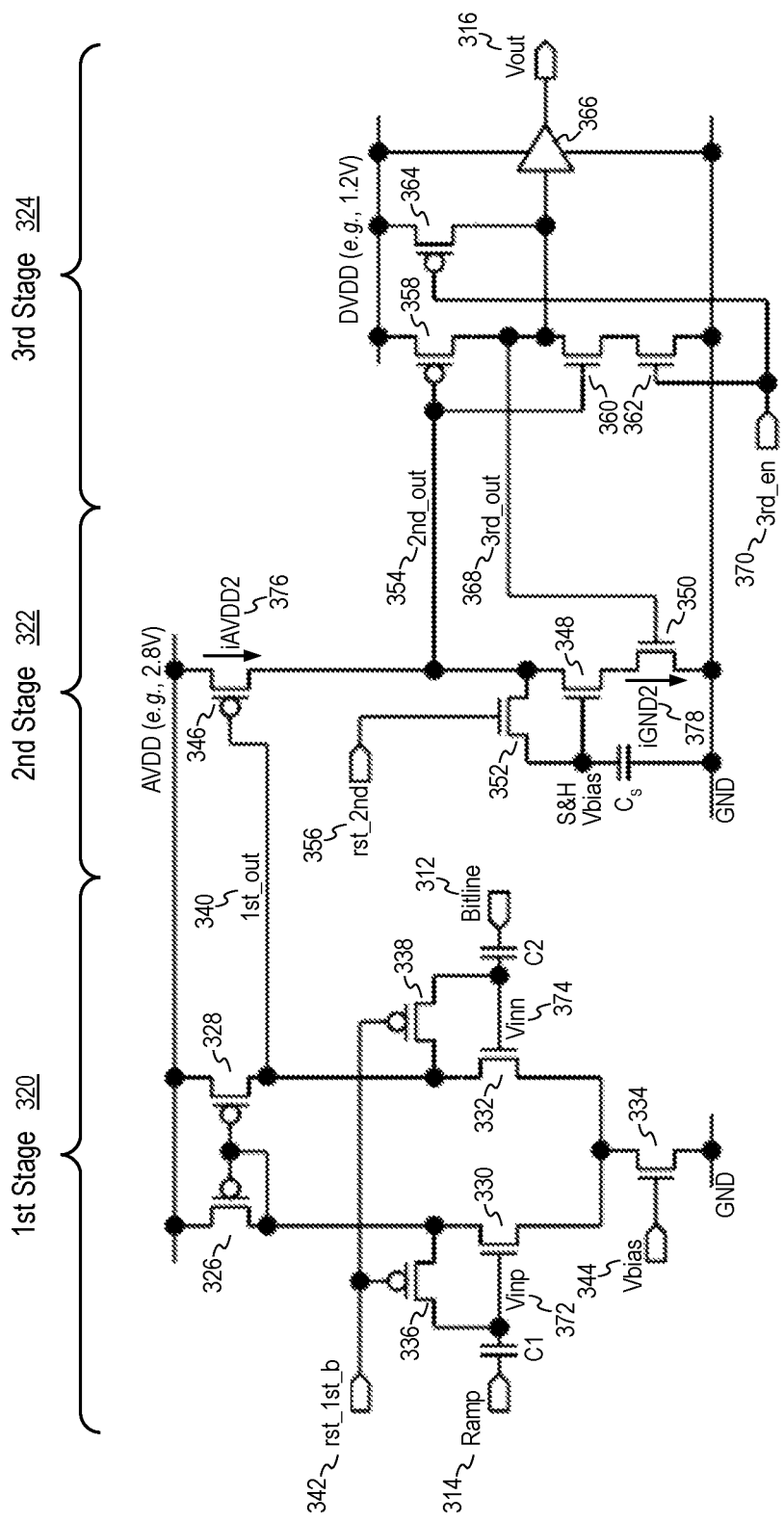
FIG. 3A illustrates a schematic that shows an example of a comparator with multiple stages for use with an analog to digital converter in an image sensor in accordance with the teachings of the present invention.

FIG. 3A illustrates a schematic that shows an example of a comparator with multiple stages for use with an analog to digital converter in an image sensor in accordance with the teachings of the present invention. It is appreciated that the example comparator illustrated of FIG. 3A may be an example implementation of comparator 116 as shown in FIG. 1A, and that similarly named and numbered elements described above are coupled and function similarly below.

As shown, the example comparator illustrated in FIG. 3A includes a first stage 320 coupled to a second stage 322 coupled to a third stage 324. The first stage 320 includes transistor 326, transistor 328, transistor 330, transistor 332, transistor 334, transistor 336, and transistor 338. The sources of transistors 326 and 328 are coupled to a supply voltage AVDD. In one example, the supply voltage AVDD is an analog supply voltage equal to approximately 2.8V. In other examples, it is appreciated that supply voltage AVDD may have a different value. The gates of transistors 326 and 328 are coupled together and are coupled to the drain of transistor 326. The drain of transistor 330 is coupled to the drain of transistor 326, and the drain of transistor 332 is coupled to the drain of transistor 328. Transistor 334 is coupled between the sources of transistors 330 and 332 and a reference voltage. In one example, the reference voltage is substantially equal to ground.

The gate of transistor 330 is capacitively coupled to receive ramp 314 through capacitor C1, and the gate of transistor 332 is capacitively coupled to receive bitline 312 through capacitor C2. In the example depicted in FIG. 3A, the voltage at the gate of transistor 330 is labeled Vinp 372, and the voltage at the gate of transistor 332 is labeled Vinn 374. The drain of transistor 328 is configured to generate the output of the first stage output signal 1st_out 340. Transistor 336 is coupled between a drain and the gate of transistor 330 and transistor 338 is coupled between a drain and the gate of the transistor 332. In the depicted example, transistors 336 and 338 are first and second auto-zero transistors that are coupled to be switched in response to a first stage reset signal rst_1st_b 342. In the example, transistors 336 and 338 are p channel (e.g., PMOS) transistors that are configured to be turned on in response to a logic low value from first stage reset signal rst_1st_b 342.

The example depicted in FIG. 3A illustrates that the second stage 322 includes transistor 346, transistor 348, transistor 350, transistor 352, and a storage capacitor $C_S$. Transistor 346 is coupled to the supply voltage AVDD. The gate of transistor 346 is coupled to receive and be responsive to first stage output signal 1st_out 340 from the first stage 320. Transistor 346 is coupled generate a second stage output signal 2nd_out 354 in response to the first stage output signal 1st_out 340.

Transistor 348 is coupled to transistor 346, and transistor 350 is coupled to transistor 346 through transistor 348. In the depicted example, the gate of transistor 350 is coupled to receive and be responsive to a third stage output signal 3rd_out 368. As will be discussed, transistor 350 is configured to be a DC cut device that is coupled to be switched in response to the third stage output signal 3rd_out 368 in accordance with the teachings of the present invention.

As shown, transistor 346, transistor 348, and transistor 350 are coupled between the supply voltage AVDD and the reference voltage. Storage capacitor $C_S$ is coupled between the reference voltage and the gate of transistor 348. In the example, storage capacitor $C_S$ is configured to sample and hold a bias voltage Vbias that is coupled to bias the gate of transistor 348. In the example, transistor 352 is coupled between the drain of transistor 348 and storage capacitor $C_S$ to provide the bias voltage Vbias that is sampled and held in storage capacitor $C_S$ from the drain of transistor 348 in response to a second stage reset signal rst_2nd 356.

The current iAVDD2 376 represents the current through transistor 346 and the current iGND2 378 represents the current through transistor 350. In operation, a second stage current of the second stage 322, which includes iAVDD2 376 and iGND2 378, is conducted through transistor 346, transistor 348, and transistor 350. As will be discussed in greater detail below, transistor 350 is a DC cut device as it is switched off in response to the third stage output signal 3rd_out 368, which cuts off the current through transistor 350 and therefore cuts off the second stage current of second stage 322 in response to the third stage output signal 3rd_out 368. Thus, the second stage current of second stage 322, which includes iAVDD2 376 and iGND2 378, is substantially zero before and after switching transitions of the transistor 346 and transistor 350 in accordance with the teachings of the present invention.

The example depicted in FIG. 3A illustrates that the third stage 324 includes transistor 358, transistor 360, transistor 362, transistor 364 and buffer 366. Transistor 358 and transistor 364 are coupled to the supply voltage DVDD. In one example, the supply voltage DVDD is a digital supply voltage equal to approximately 1.2V. In other examples, it is appreciated that supply voltage DVDD may have a different value. Transistor 360 is coupled to transistor 358, and transistor 362 is coupled between transistor 360 and the reference voltage. Buffer 366 has an input that is coupled to a node between transistor 358 and transistor 360. The third stage output signal 3rd_out 368 is generated at the node between transistor 358 and transistor 360. Buffer 366 is coupled between rails provided by the supply voltage DVDD and the reference voltage. The output of buffer 366 is the output voltage of the comparator Vout 316. The gate of transistor 358 and the gate of transistor 360 are coupled to receive and be responsive to the second stage output signal 2nd_out 354. The gate of transistor 362 and the gate of transistor 364 are coupled to receive and be responsive to a third stage enable signal 3rd_en 370.

Figure 3B:
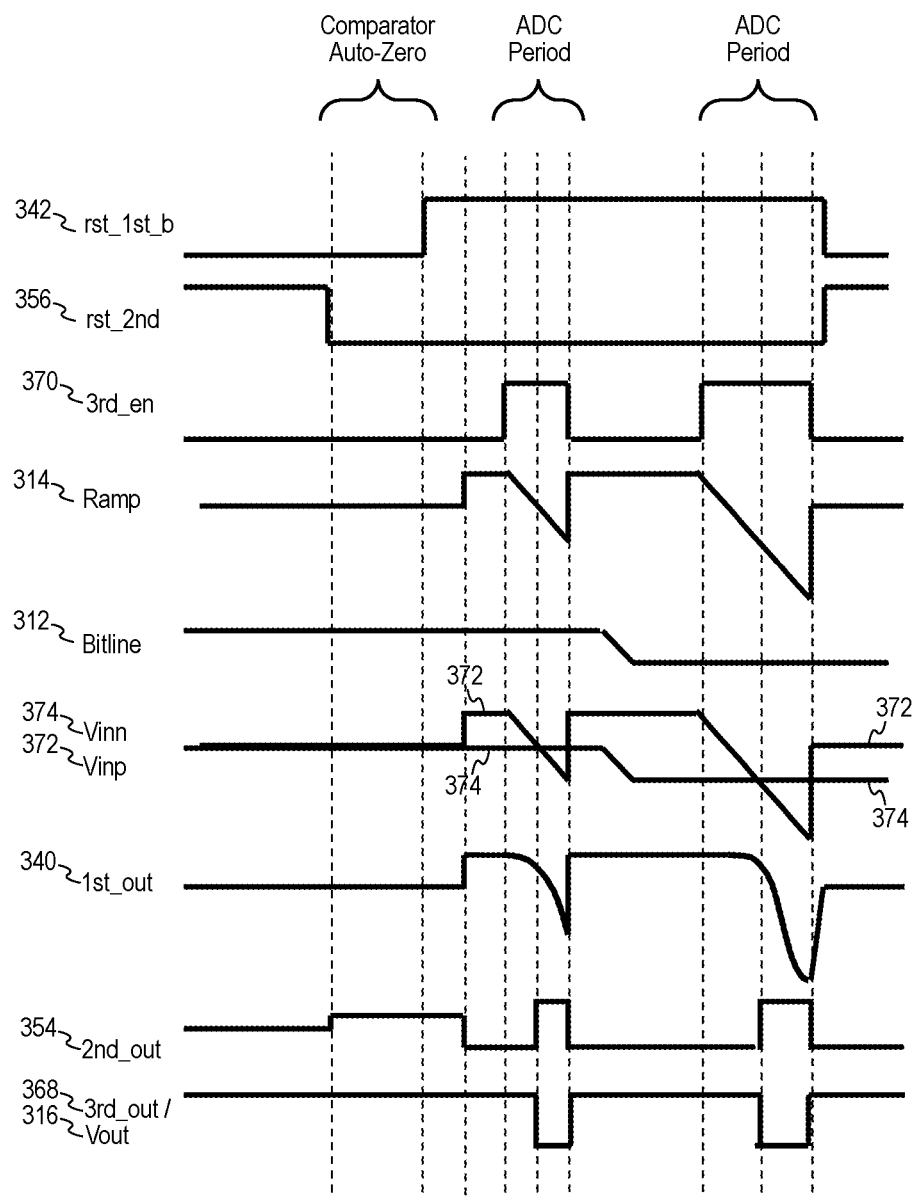
FIG. 3B is a timing diagram that illustrates some of the signals associated with a comparator as illustrated in FIG. 3A during an analog to digital conversion in an image sensor in accordance with the teachings of the present invention.

FIG. 3B is a timing diagram that illustrates some of the signals associated with the comparator as illustrated in FIG. 3A during an auto-zero period and analog to digital conversions in an image sensor in accordance with the teachings of the present invention. In the example, the comparator is used in a single slope ADC and the comparator is configured to compare the bitline voltage 312 with a ramp 314. The example of FIG. 3B shows a comparator auto-zero period occurring between the first and second vertical dashed lines, a first ADC period occurring between the fourth and sixth vertical dashed lines, and a second ADC period occurring between the seventh and ninth vertical dashed lines. In addition, FIG. 3B shows an example of the first stage reset signal rst_1st_b 342, second stage reset signal rst_2nd 356, third stage enable signal 3rd_en 370, ramp signal 314, bitline signal 312, Vinn 374, Vinp 372, first stage output signal 1st_out 340, second stage output signal 2nd_out 354, third stage output signal 3rd_out 368, and comparator output Vout 316. In the depicted example, it is noted that the third stage output signal 3rd_out 368 and the comparator output Vout 316 can be represented with the same graph in the depicted example as the output of buffer 366 follows the third stage output signal 3rd_out 368 coupled to the input of buffer 366 in the depicted example.

As shown in the example depicted in FIG. 3B, the rst_1st_b 342 and rst_2nd 356 signals are configured to turn on and off transistors 336, 338, and 352 to auto-zero the 1st stage 320 and the 2nd stage 322 during the comparator auto-zero period. Before rst_2nd 356 transitions to low, the 2nd_out 354 output is the bias voltage for transistors 348 and 350. When rst_2nd 356 is high, transistor 352 is on and the gate and the drain of transistor 348 are coupled together. In this way, the 2nd_out 354 voltage, which is same as the gate voltage of transistor 348, is set to make transistor 348 draw the same current as transistor 346 outputs (i.e., iAVDD2=iGND2). When rst_2nd 356 transitions turns to low, the bias voltage is sampled and held. After the rst_1st_b 342 and rst_2nd 356 signals turn off transistors 336, 338, and 352 in the auto-zero period, the first ADC period occurs. As shown, at the beginning of each ADC period, the first stage output signal 1st_out 340 is high, which turns off transistor 346. With, transistor 346 turned off at the beginning of each ADC period, iAVDD2 376 and the second stage current through the second stage 322 is substantially zero at the beginning of each ADC period in accordance with the teachings of the present invention.

Continuing with the depicted example, the ramp voltage is increased and then starts to ramp down as indicated with the ramp 314 signal during each ADC period. The 3rd_en 370 is high during each ADC period, which enables the third stage 324 and covers the ramp down period of the ramp 314 signal during the ADC periods.

In the depicted example, the Vinp 372 signal follows the ramp 314 signal, and the Vinn 374 signal follows the bitline 312 signal. As shown, when the Vinp 372 signal ramps down to a value that is less than or equal to the Vinn 374 signal during the ADC periods, the first stage output signal 1st_out 340 turns on transistor 346, which transitions the second stage output signal 2nd_out 354 from a low value to a high value, which turns off transistor 358 and turns on transistor 360. With the 3rd_en 370 signal high during the first and second ADC periods, the comparator output (e.g., Vout 316) transitions or flips from a first state to a second state and the third stage output signal 3rd_out 368 transitions from a high value to a low value in response to the second stage output signal 2nd_out 354 transitioning from the low value to a high value.

With the third stage output signal 3rd_out 368 transitioning from the high value to the low value, transistor 350 is turned off, which cuts off the iGND2 378 current and the second stage current through the second stage 322 in accordance with the teachings of the present invention after transistor 346 is turned on. Thus, transistor 350 functions as a DC cut device that prevents second stage current after the comparator transitions or flips in accordance with the teachings of the present invention. As such, the second stage current is substantially zero before and after switching transitions of the transistors in the comparator in response to the Vinp 372 signal ramping down to values that are less than or equal to the Vinn 374 signal during the ADC periods in accordance with the teachings of the present invention.

Figure 3C:
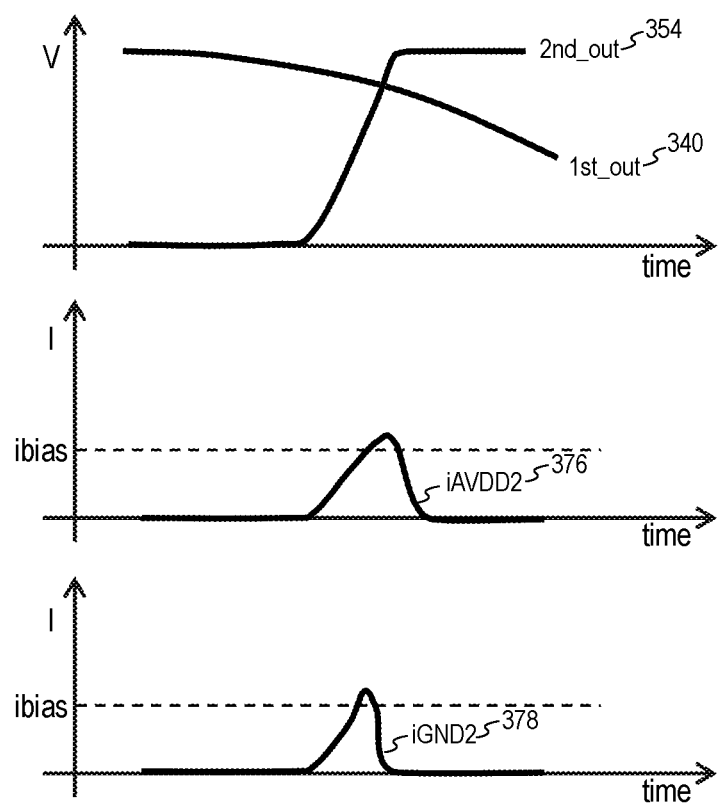
FIG. 3C is a timing diagram that illustrates some additional signals associated with a comparator as illustrated in FIG. 3A during an analog to digital conversion in an image sensor in accordance with the teachings of the present invention.

FIG. 3C is a timing diagram that illustrates some additional signals associated with a comparator as illustrated in FIG. 3A during an analog to digital conversion in an image sensor in accordance with the teachings of the present invention. In particular, the timing diagram illustrated in FIG. 3C shows current consumption in the second stage 322 during an ADC period. At the beginning of the ADC period, first stage output signal 1st_out 340 is high, which turns off transistor 346 of the second stage 322. As such, iAVDD2 376 is zero and there is no DC current in second stage 322. When the Vinp 372 signal ramps down to a value that is less than or equal to the Vinn 374 signal, the first stage output signal 1st_out 340 drops, transistor 346 turns on and starts to draw the iAVDD2 376 current as well as the iGND2 378 current while transistor 350 is still turned on. However, as the second stage output signal 2nd_out 354 voltage continues to rise, the third stage output signal 3rd_out 368 continues to fall and then turns off transistor 350, which cuts off the DC current through transistor 350 and therefore cuts off the DC current through the second stage 322 in accordance with the teachings of the present invention.

Figure 4A:
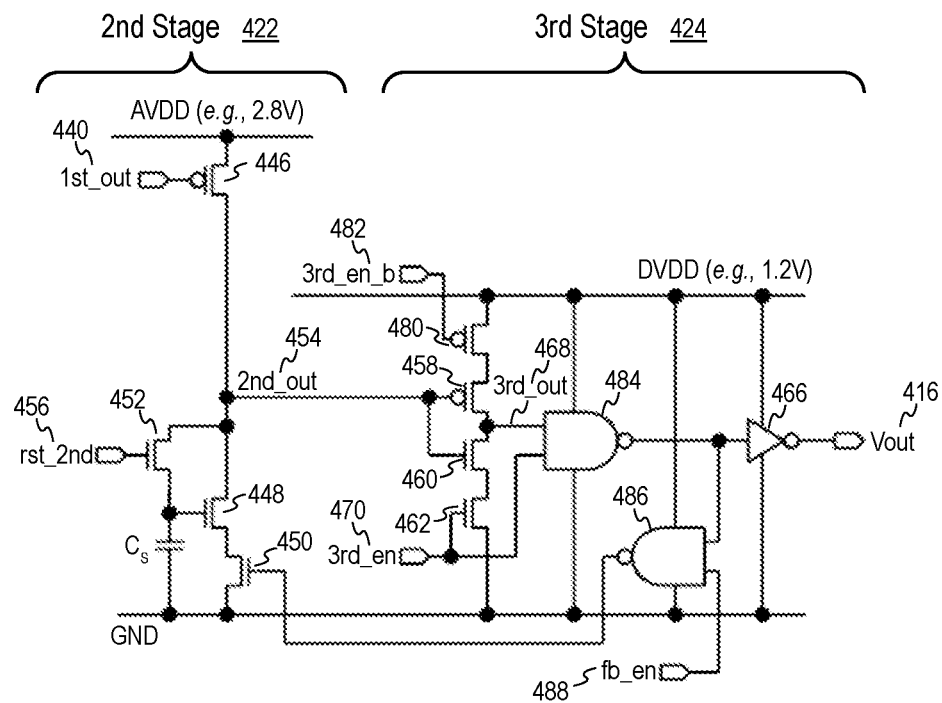
FIG. 4A illustrates a schematic that shows another example of a comparator with multiple stages for use with an analog to digital converter in an image sensor in accordance with the teachings of the present invention.

FIG. 4A illustrates a schematic that shows another example of the second and third stages of a comparator with multiple stages for use with an analog to digital converter in an image sensor in accordance with the teachings of the present invention. It is appreciated that the example comparator illustrated of FIG. 4A may be an example implementation of comparator 116 as shown in FIG. 1A, and that similarly named and numbered elements described above are coupled and function similarly below. It is also appreciated that the example comparator illustrated in FIG. 4A shares similarities with the example comparator illustrated in FIG. 3A.

For instance, the example comparator illustrated in FIG. 4A includes a second stage 422 coupled to a third stage 424. The second stage 422 includes transistor 446, transistor 448, transistor 450, transistor 452, and a storage capacitor $C_S$. Transistor 446 is coupled to the supply voltage AVDD. The gate of transistor 446 is coupled to receive and be responsive to first stage output signal 1st_out 440. It is appreciated that a first stage (not illustrated in FIG. 4A) generates first stage output signal 1st_out 440 in response to comparing a ramp signal with a bitline signal during each ADC period. The first stage output signal 1st_out 440 is coupled to be received by second stage 422. Transistor 446 is coupled generate a second stage output signal 2nd_out 454 in response to the first stage output signal 1st_out 440.

Transistor 448 is coupled to transistor 446, and transistor 450 is coupled to transistor 446 through transistor 448. In the depicted example, the gate of transistor 450 is coupled to receive and be responsive to a third stage output signal 3rd_out 468. Thus, transistor 450 is configured to be a DC cut device that is coupled to be switched in response to the third stage output signal 3rd_out 468 in accordance with the teachings of the present invention.

As shown, transistor 446, transistor 448, and transistor 450 are coupled between the supply voltage AVDD and the reference voltage. Storage capacitor $C_S$ is coupled between the reference voltage and the gate of transistor 448. In the example, storage capacitor $C_S$ is configured to sample and hold a bias voltage Vbias that is coupled to bias the gate of transistor 448. In the example, transistor 452 is coupled between the drain of transistor 448 and storage capacitor $C_S$ to provide the bias voltage Vbias that is sampled and held in storage capacitor $C_S$ from the drain of transistor 448 in response to a second stage reset signal rst_2nd 456.

In operation, a second stage current of the second stage 422 is conducted through transistor 446, transistor 448, and transistor 450. As will be discussed, transistor 450 is a DC cut device as it is switched off in response to an output from the third stage 424, which cuts off the second stage current of second stage 422 in response to the output from the third stage 424. Thus, the second stage current of second stage 422 is substantially zero before and after the comparator transitions or flips in accordance with the teachings of the present invention.

The example depicted in FIG. 4A illustrates that the third stage 424 includes transistor 458, transistor 460, transistor 462, transistor 480, inverter 466, NAND gate 484, and NAND gate 486. Transistor 480 is coupled to the supply voltage DVDD, and transistor 458 is coupled to transistor 480. Transistor 460 is coupled to transistor 458, and transistor 462 is coupled between transistor 460 and the reference voltage. The third stage output signal 3rd_out 468 is generated at the node between transistor 458 and transistor 460. Transistor 462 is coupled to be switched or be responsive to the third stage enable signal 3rd_en 470, and transistor 480 is coupled to be switched or be responsive to a complement of the third stage enable signal 3rd_en_b 482. A first input of a NAND gate 484 is coupled to the node between the transistor 458 and transistor 460. A second input of NAND gate 484 is coupled to receive the third stage enable signal 3rd_en 470. A first input of a NAND gate 486 is coupled to receive a complement of the third stage output signal 3rd_out 468 from an output of the first NAND gate 484 in response to the third stage enable signal 3rd_en 470. A second input of NAND gate 486 is coupled to receive a feedback enable signal fb_en 488. Thus, the output of NAND gate 486 is also configured to regenerate the third stage output signal 3rd_out 468 in response to the feedback enable signal fb_en 488 and the third stage enable signal 3rd_en 470. The transistor 450 is coupled to be switched in response to the third output signal 3rd_en 468, which is coupled to be received from the output of the NAND gate 486. The inverter 466 has an input that is coupled to the output of NAND gate 484. The inverter 466 is coupled between rails provided by the supply voltage DVDD and the reference voltage. The output of inverter 466 is configured to provide the output voltage of the comparator Vout 416.

Figure 4B:
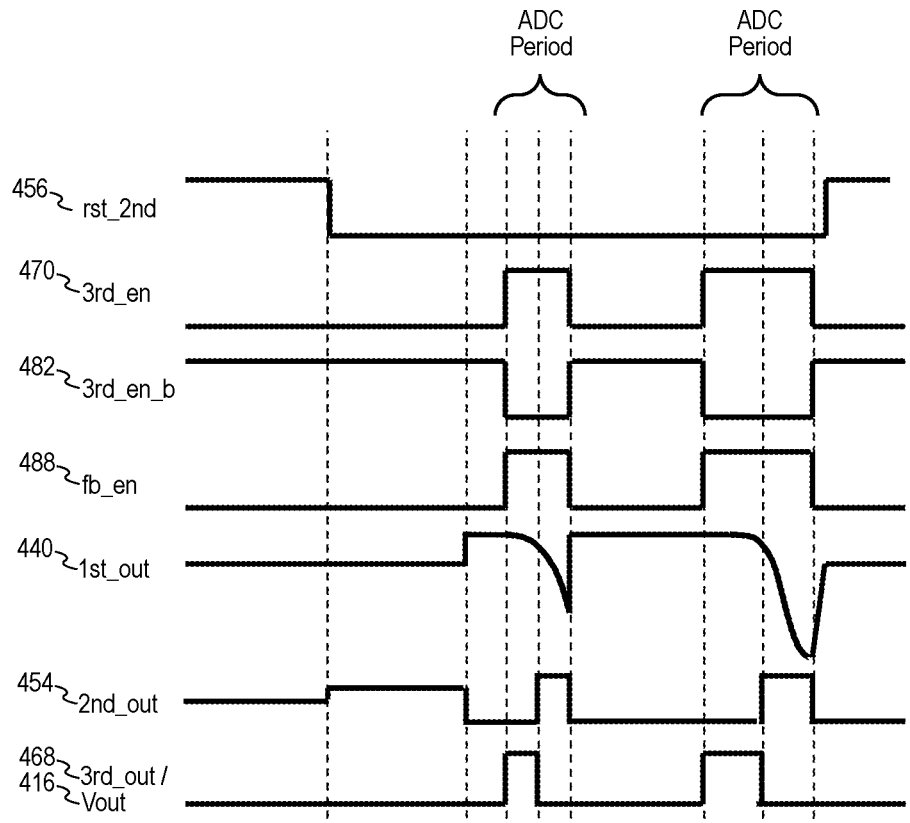
FIG. 4B is a timing diagram that illustrates some of the signals associated with a comparator as illustrated in FIG. 4A during an analog to digital conversion in an image sensor in accordance with the teachings of the present invention.

FIG. 4B is a timing diagram that illustrates some of the signals associated with a comparator as illustrated in FIG.

4A during an auto-zero period and during an analog to digital conversion in an image sensor in accordance with the teachings of the present invention. In the example, the comparator is used in a single slope ADC and the comparator is configured to compare a bitline voltage with a ramp signal. The example of FIG. 4B shows a first ADC period occurring between the third and fifth vertical dashed lines, and a second ADC period occurring between the sixth and eighth vertical dashed lines. In addition, FIG. 4B shows an example of the second stage reset signal rst_2nd 456, third stage enable signal 3rd_en 470, the complement of the third stage enable signal 3rd_en_b 482, feedback enable signal fb_en 488, first stage output signal 1st_out 440, second stage output signal 2nd_out 454, third stage output signal 3rd_out 468, and comparator output Vout 416. In the depicted example, it is noted that the third stage output signal 3rd_out 468 and the comparator output Vout 416 can be represented with the same graph in the depicted example as the output of inverter 466 follows the third stage output signal 3rd_out 468.

As shown in the example depicted in FIG. 4B, the rst_2nd 456 signal is initially configured to turn on and off transistor 452, which auto-zeros the 2nd stage 422 during a comparator auto-zero period. Similar to the example described in FIG. 3B, when rst_2nd 456 is high, 2nd_out 454 is biased to make the current through transistors 448 and 450 the same as that of transistor 446. That bias voltage on 2nd_out 454 is sampled and held when rst_2nd 456 transitions to low. After the rst_2nd 456 signal turns off transistor 452 in the auto-zero period, the ramp voltage (not shown) is increased and then starts to ramp down during each ADC period. As shown, at the beginning of each ADC period, the first stage output signal 1st_out 440 is high, which turns off transistor 446. With transistor 446 turned off at the beginning of each ADC period, the second stage current through the second stage 422 is substantially zero at the beginning of each ADC period in accordance with the teachings of the present invention.

The example depicted in FIG. 4B shows that the 3rd_en 470 signal is high, the complement signal 3rd_en_b 482 is low, and the feedback enable signal fb_en 488 is high during each ADC period, which enables the third stage 424 and covers the ramp down period of the ramp signal during the ADC periods as discussed above. It is also noted that in the example depicted in FIG. 4B, the third stage output signal 3rd_out 468 and Vout 416 signal are low when the 3rd_en 470 signal is low, the complement signal 3rd_en_b 482 is high, and the feedback enable signal fb_en 488 is low. At the beginning of each ADC period when the 3rd_en 470 signal is high, the complement signal 3rd_en_b 482 is low, and the feedback enable signal fb_en 488 is high, the third stage output signal 3rd_out 468 and Vout 416 signal are high until the comparator flips, at which time the second stage output signal 2nd_out 454 transitions to high and the third stage output signal 3rd_out 468 and Vout 416 signals transition to low.

In particular, as the ramp signal ramps down to a value that is less than or equal to the bitline signal during the ADC periods, the first stage output signal 1st_out 440 falls and turns on transistor 446, which transitions the second stage output signal 2nd_out 454 from a low value to a high value, which turns off transistor 458 and turns on transistor 460. With the 3rd_en 470 signal high, the 3rd_en_b 482 signal low, and the feedback enable signal fb_en 488 high during the first and second ADC periods, the comparator output (e.g., Vout 416) transitions or flips from a first state to a second state and the third stage output signal 3rd_out 468 transitions from a high value to a low value in response to the second stage output signal 2nd_out 454 transitioning from the low value to a high value.

With the third stage output signal 3rd_out 468 transitioning from the high value to the low value, transistor 450 is turned off, which cuts off the second stage current through the second stage 422 in accordance with the teachings of the present invention after transistor 446 is turned on. Thus, transistor 450 functions as a DC cut device that prevents second stage current after the comparator transitions or flips in accordance with the teachings of the present invention. As such, the second stage current is substantially zero before and after switching transitions of the transistors in the comparator in response to the ramp signal ramping down to values that are less than or equal to the bitline signal during the ADC periods in accordance with the teachings of the present invention.

Figure 5A:
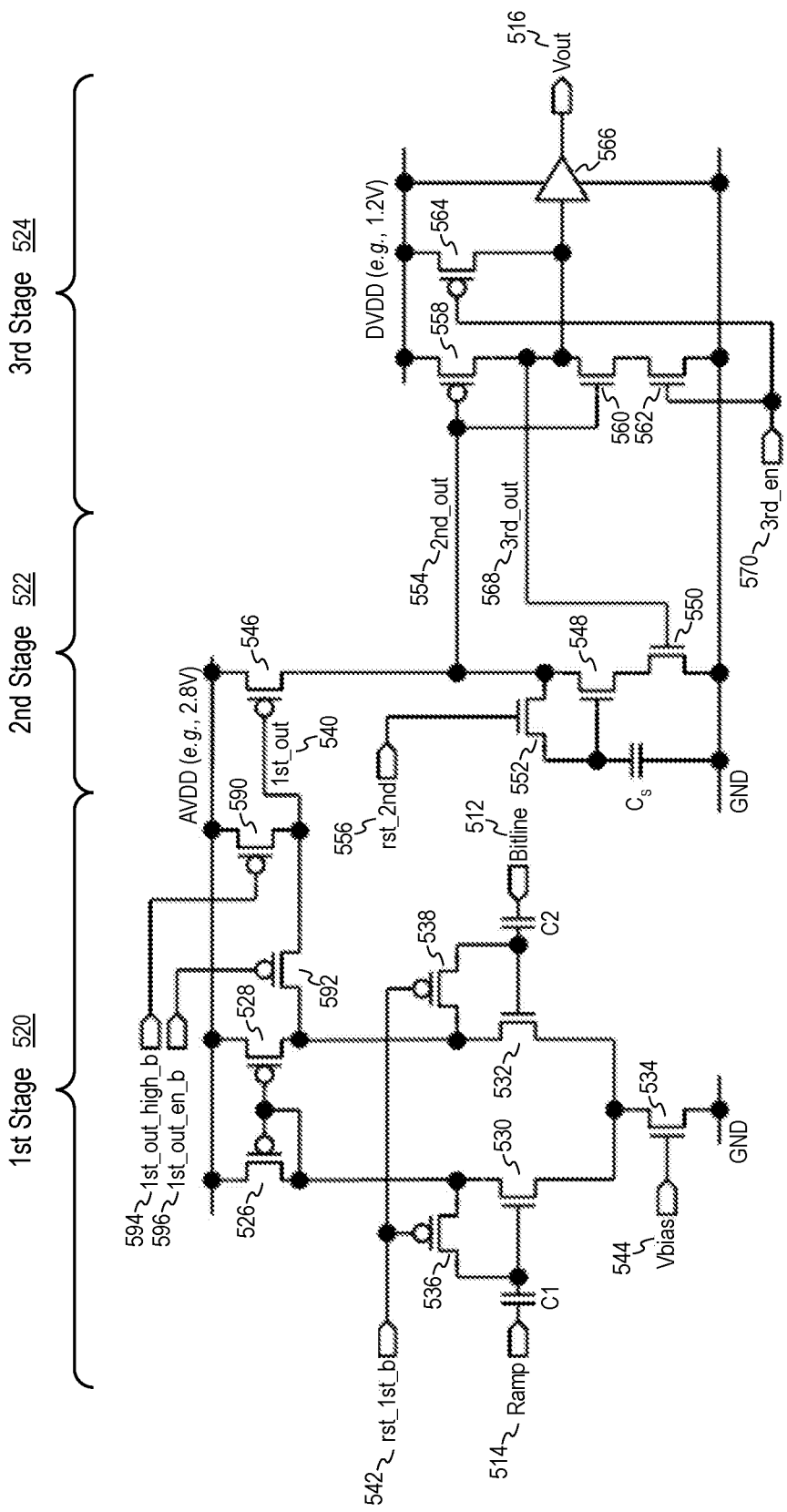
FIG. 5A illustrates a schematic that shows yet another example of a comparator with multiple stages for use with an analog to digital converter in an image sensor in accordance with the teachings of the present invention.

FIG. 5A illustrates a schematic that shows yet another example of a comparator with multiple stages for use with an analog to digital converter in an image sensor in accordance with the teachings of the present invention. It is appreciated that the example comparator illustrated of FIG. 5A may be an example implementation of comparator 116 as shown in FIG. 1A, and that similarly named and numbered elements described above are coupled and function similarly below. It is also appreciated that the example comparator illustrated in FIG. 5A shares similarities with the example comparator illustrated in FIG. 3A and the example comparator illustrated in FIG. 4A.

For instance, the example comparator illustrated in FIG. 5A includes a first stage 520 coupled to a second stage 522 coupled to a third stage 524. The first stage 520 includes transistor 526, transistor 528, transistor 530, transistor 532, transistor 534, transistor 536, transistor 538, transistor 590, and transistor 592. The sources of transistors 526, 528, and 590 are coupled to a supply voltage AVDD. The gates of transistors 526 and 528 are coupled together and are coupled to the drain of transistor 526. The drain of transistor 530 is coupled to the drain of transistor 526, and the drain of transistor 532 is coupled to the drain of transistor 528. Transistor 534 is coupled between the sources of transistors 530 and 532 and a reference voltage.

The gate of transistor 530 is capacitively coupled to receive ramp 514 through capacitor C1, and the gate of transistor 532 is capacitively coupled to receive bitline 512 through capacitor C2. The drain of transistor 528 is configured to generate the output of the first stage output signal 1st_out 540 through transistor 592 in response to a first stage output enable signal 1st_out_en_b 596. In the depicted example, transistor 592 is a p channel transistor (e.g., PMOS) and the first stage output enable signal 1st_out_en_b 596 therefore turns on transistor 592 in response to a logic low value. In the example, transistor 590 is coupled to pull the first stage output signal 1st_out 540 to a high value (e.g., AVDD) in response to a first stage output high signal 1st_out_high_b 594. In the example, transistor 590 is a p channel transistor and first stage output high signal 1st_out_high_b 594 therefore turns on transistor 590 in response to a logic low value.

Transistor 536 is coupled between a drain and the gate of transistor 530 and transistor 538 is coupled between a drain and the gate of the transistor 532. In the depicted example, transistors 536 and 538 are first and second auto-zero transistors that are coupled to be switched in response to a first stage reset signal rst_1st_b 542. In the example, transistors 536 and 538 are p-channel transistors that are configured to be turned on in response to a logic low value from first stage reset signal rst_1st_b 542.

The example depicted in FIG. 5A illustrates that the second stage 522 includes transistor 546, transistor 548, transistor 550, transistor 552, and a storage capacitor $C_S$. Transistor 546 is coupled to the supply voltage AVDD. The gate of transistor 546 is coupled to receive and be responsive to first stage output signal 1st_out 540 from the first stage 520 when transistor 590 is turned off in response to the first stage output high signal 1st_out_high_b 594. Transistor 546 is coupled generate a second stage output signal 2nd_out 554 in response to the first stage output signal 1st_out 540.

Transistor 548 is coupled to transistor 546, and transistor 550 is coupled to transistor 546 through transistor 548. In the depicted example, the gate of transistor 550 is coupled to receive and be responsive to a third stage output signal 3rd_out 568. Thus, transistor 550 is configured to be a DC cut device that is coupled to be switched in response to the third stage output signal 3rd_out 568 in accordance with the teachings of the present invention.

As shown, transistor 546, transistor 548, and transistor 550 are coupled between the supply voltage AVDD and the reference voltage. Storage capacitor $C_S$ is coupled between the reference voltage and the gate of transistor 548. In the example, storage capacitor $C_S$ is configured to sample and hold a bias voltage Vbias that is coupled to bias the gate of transistor 548. In the example, transistor 552 is coupled between the drain of transistor 548 and storage capacitor $C_S$ to provide the bias voltage Vbias that is sampled and held in storage capacitor $C_S$ from the drain of transistor 548 in response to a second stage reset signal rst_2nd 556.

In operation, a second stage current of the second stage 522 is conducted through transistor 546, transistor 548, and transistor 550. As will be discussed in greater detail below, transistor 550 is a DC cut device as it is switched off in response to third stage output signal 3rd_out 568, which cuts off the second stage current of second stage 522 in response to third stage output signal 3rd_out 568. Thus, the second stage current of second stage 522 is substantially zero before and after switching transitions of the transistor 546 and transistor 550 in accordance with the teachings of the present invention.

The example depicted in FIG. 5A illustrates that the third stage 524 includes transistor 558, transistor 560, transistor 562, transistor 564 and buffer 566. Transistor 558 and transistor 564 are coupled to the supply voltage DVDD. Transistor 560 is coupled to transistor 558, and transistor 562 is coupled between transistor 560 and the reference voltage. Buffer 566 has an input that is coupled to a node between transistor 558 and transistor 560. The third stage output signal 3rd_out 568 is generated at the node between transistor 558 and transistor 560. Buffer 566 is coupled between rails provided by the supply voltage DVDD and the reference voltage. The output of buffer 566 is the output voltage of the comparator Vout 516. The gate of transistor 558 and the gate of transistor 560 are coupled to receive and be responsive to the second stage output signal 2nd_out 554. The gate of transistor 562 and the gate of transistor 564 are coupled to receive and be responsive to a third stage enable signal 3rd_en 570.

Figure 5B:
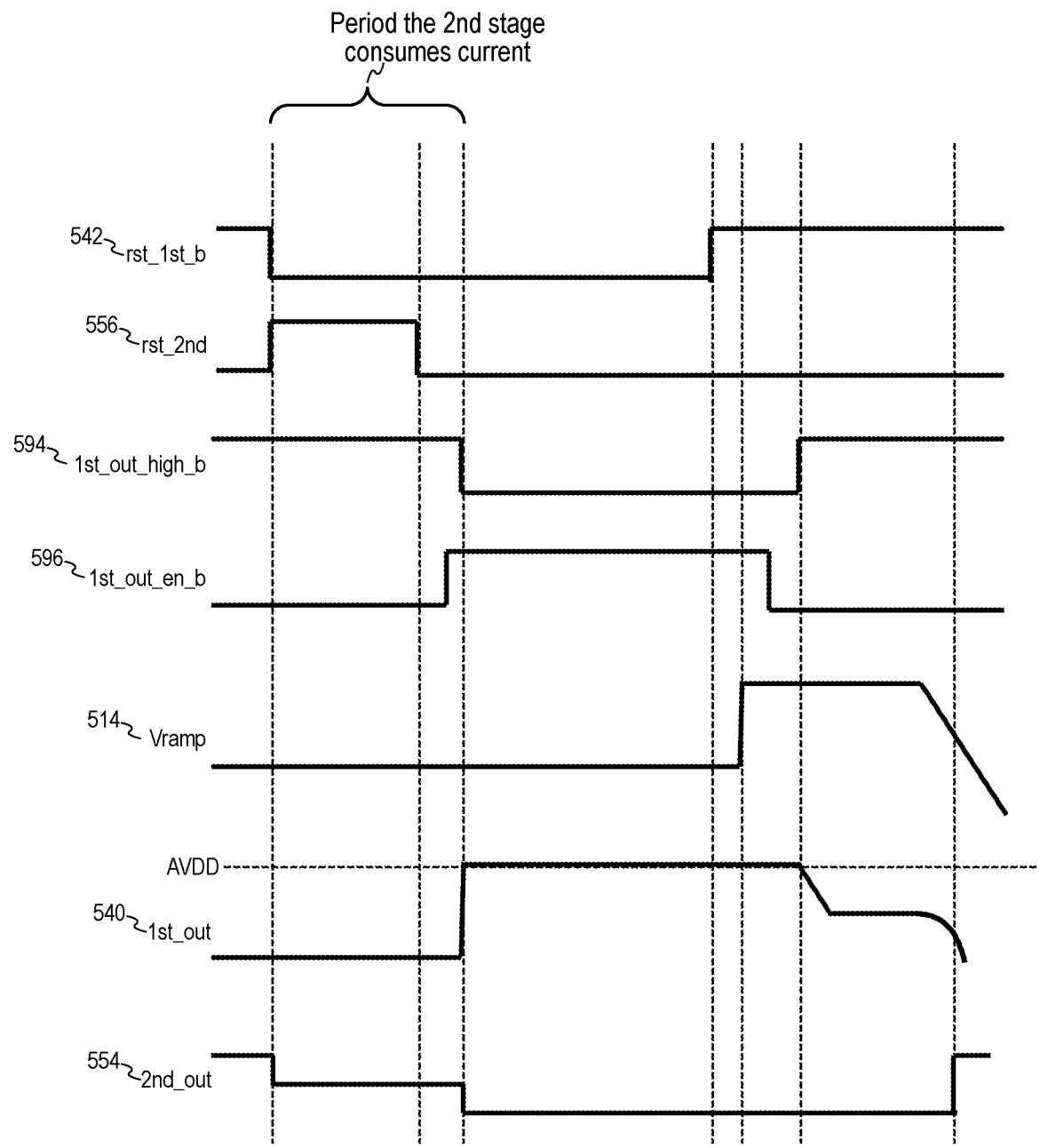
FIG. 5B is a timing diagram that illustrates some of the signals associated with a comparator as illustrated in FIG. 5A during an auto-zero period and during an analog to digital conversion in an image sensor in accordance with the teachings of the present invention.

FIG. 5B is a timing diagram that illustrates some of the signals associated with a comparator as illustrated in FIG. 5A during an auto-zero period and during an analog to digital conversion in an image sensor in accordance with the teachings of the present invention. In particular, FIG. 5B shows an example of first stage reset signal rst_1st_b 542, second stage reset signal rst_2nd 556, first stage output high signal 1st_out_high_b 594, first stage output enable signal 1st_out_en_b 596, ramp signal Vramp 514, first stage output signal 1st_out 540, and second stage output signal 2nd_out 554.

As shown in the depicted example, the first stage reset signal rst_1st_b 542 transitions to a logic low level and the second stage reset signal rst_2nd 556 transitions to a logic high level at the first vertical dashed line in FIG. 5B. Thus, at this time, transistors 536 and 538 are turned on to auto-zero the first stage 520, and transistor 552 is turned on to reset the second stage 522 and sample and hold the bias voltage value from the drain of transistor 548 into the storage capacitor $C_S$ at the gate of transistor 548. When 2nd stage 522 is reset, during the period labeled "Period the 2nd stage consumes current" in FIG. 5B, the 2nd stage 522 consumes current and the 2nd_out 554 outputs the bias voltage for transistor 548. The bias voltage is sampled and held on the capacitor $C_S$ when rst_2nd 556 transitions to low. In this configuration, 1st_out 540 is pulled up to AVDD after the bias voltage is sampled and held so that transistor 546 is off and 2nd stage 522 current becomes zero.

At this time, it is noted that the first stage output high signal 1st_out_high_b 594 is at a logic high level and that the first stage output enable signal 1st_out_en_b 596 is at a logic low level so that transistor 590 is turned off and transistor 592 is turned on at this time. As such, the bias voltage of the first stage output signal 1st_out 540 is coupled to be received by the second stage 522, which turns on transistor 546 and starts to draw bias current to reset the 2nd stage 522. With transistor 546 turned on, the gate and the drain of the transistor 548 are electrically connected, the 2nd_out voltage is set to make the transistor 548 draw the same current as the transistor 546 so that a bias voltage can be sampled and held from the drain of transistor 548 into the storage capacitor $C_S$ at the gate of transistor 548. At the second vertical dashed line, after the bias voltage has been sampled and held from the drain of transistor 548 into the storage capacitor $C_S$, the second stage reset signal rst_2nd 556 transitions to a logic low level, which turns off transistor 552. At the third vertical dashed line, the first stage output high signal 1st_out_high_b 594 transitions to a logic low value, which turns on transistor 590, which therefore pulls up the first stage output signal 1st_out 540 to a logic high AVDD, which turns off transistor 546 in the second stage so that the second stage 522 is prevented from consuming current after bias voltage has been sampled and held during the second stage auto-zero period as discussed.

Continuing with the example depicted in FIG. 5B, first stage reset signal rst_1st_b 542 transitions to a logic high level at the fourth vertical dashed line, at which time transistors 536 and 538 are turned off to complete the auto-zero period of the first stage 520. The ramp signal Vramp 514 rises at the fifth vertical dashed line in preparation for the ADC operation. Afterwards, the first stage output enable signal 1st_out_en_b 596 transitions to the low logic level and the first stage output high signal 1st_out_high_b 594 transitions to the logic high level so that transistor 590 is turned off and transistor 592 is turned on at the sixth vertical dashed line. Thus, the second stage is now enabled to receive and be responsive to the first stage output signal 1st_out 540 from the first stage 520, which enables the ADC operation to occur with the comparator as the ramp signal Vramp 514 ramps down after the sixth vertical dashed line, and the 2nd_out 554 signal flips at the seventh vertical dashed line when the Vramp 514 signal ramps down to a value that is equal to or less than the bitline 512 value.

Figure 6A:
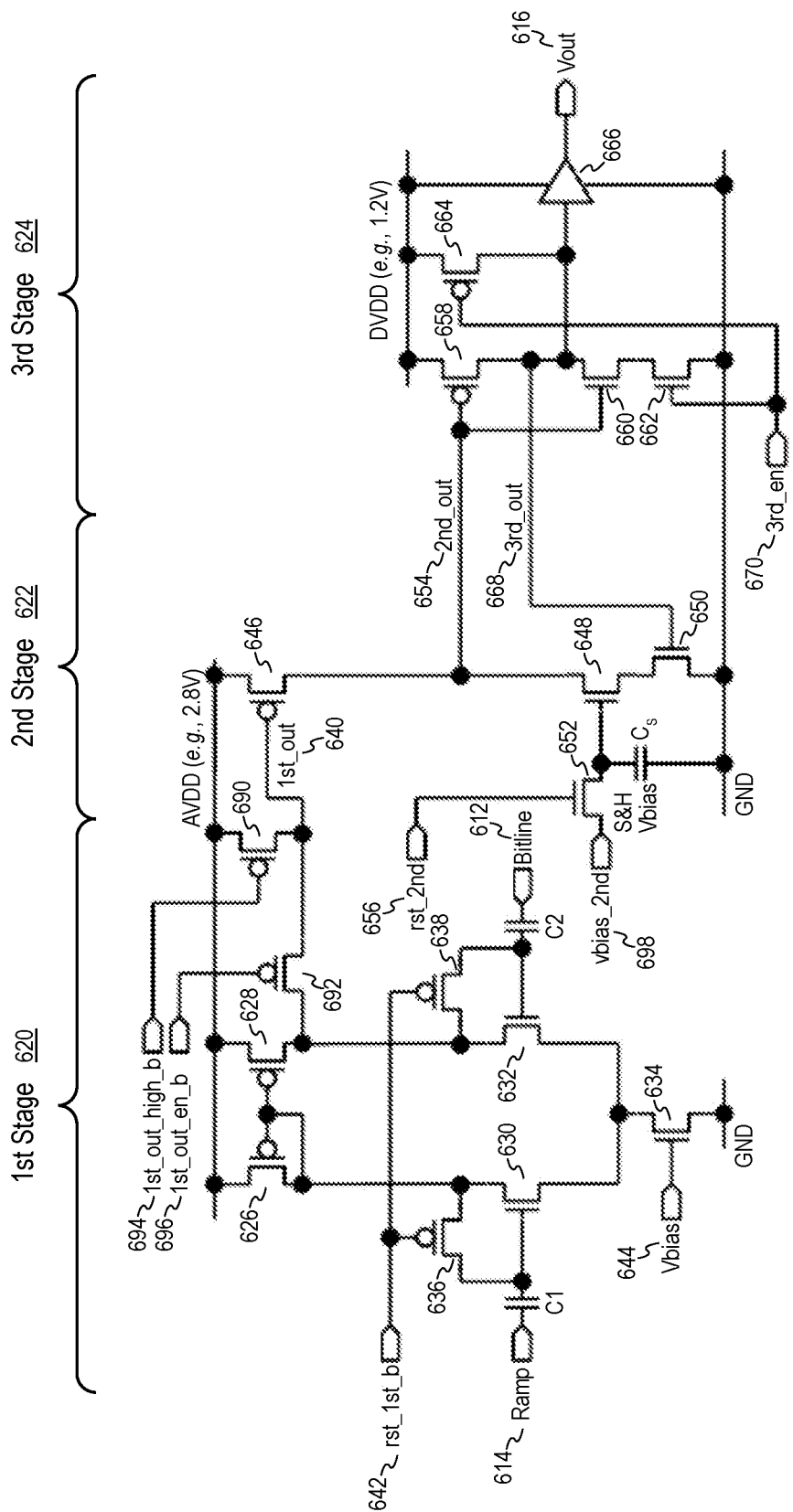
FIG. 6A illustrates a schematic that shows still another example of a comparator with multiple stages for use with an analog to digital converter in an image sensor in accordance with the teachings of the present invention.

FIG. 6A illustrates a schematic that shows still another example of a comparator with multiple stages for use with an analog to digital converter in an image sensor in accordance with the teachings of the present invention. It is appreciated that the example comparator illustrated of FIG. 6A may be an example implementation of comparator 116 as shown in FIG. 1A, and that similarly named and numbered elements described above are coupled and function similarly below. It is also appreciated that the example comparator illustrated in FIG. 6A shares similarities with the example comparator illustrated in FIG. 3A, the example comparator illustrated in FIG. 4A, and the example comparator illustrated in FIG. 5A.

For instance, the example comparator illustrated in FIG. 6A includes a first stage 620 coupled to a second stage 622 coupled to a third stage 624. The first stage 620 includes transistor 626, transistor 628, transistor 630, transistor 632, transistor 634, transistor 636, transistor 638, transistor 690, and transistor 692. The sources of transistors 626, 628, and 690 are coupled to a supply voltage AVDD. The gates of transistors 626 and 628 are coupled together and are coupled to the drain of transistor 626. The drain of transistor 630 is coupled to the drain of transistor 626, and the drain of transistor 632 is coupled to the drain of transistor 628. Transistor 634 is coupled between the sources of transistors 630 and 632 and a reference voltage.

The gate of transistor 630 is capacitively coupled to receive ramp 614 through capacitor C1, and the gate of transistor 632 is capacitively coupled to receive bitline 612 through capacitor C2. The drain of transistor 628 is configured to generate the output of the first stage output signal 1st_out 640 through transistor 692 in response to a first stage output enable signal 1st_out_en_b 696. In the depicted example, transistor 692 is a p channel transistor (e.g., PMOS) and the first stage output enable signal 1st_out_en_b 696 therefore turns on transistor 692 in response to a logic low value. In the example, transistor 690 is coupled to pull the first stage output signal 1st_out 640 to a high value (e.g., AVDD) in response to a first stage output high signal 1st_out_high_b 694. In the example, transistor 690 is a p channel transistor and first stage output high signal 1st_out_high_b 694 therefore turns on transistor 690 in response to a logic low value.

Transistor 636 is coupled between a drain and the gate of transistor 630 and transistor 638 is coupled between a drain and the gate of the transistor 632. In the depicted example, transistors 636 and 638 are first and second auto-zero transistors that are coupled to be switched in response to a first stage reset signal rst_1st_b 642. In the example, transistors 636 and 638 are p-channel transistors that are configured to be turned on in response to a logic low value from first stage reset signal rst_1st_b 642.

The example depicted in FIG. 6A illustrates that the second stage 622 includes transistor 646, transistor 648, transistor 650, transistor 652, and a storage capacitor $C_S$. Transistor 646 is coupled to the supply voltage AVDD. The gate of transistor 646 is coupled to receive and be responsive to first stage output signal 1st_out 640 from the first stage 620 when transistor 690 is turned off in response to the first stage output high signal 1st_out_high_b 694. Transistor 646 is coupled generate a second stage output signal 2nd_out 654 in response to the first stage output signal 1st_out 640.

Transistor 648 is coupled to transistor 646, and transistor 650 is coupled to transistor 646 through transistor 648. In the depicted example, the gate of transistor 650 is coupled to receive and be responsive to a third stage output signal 3rd_out 668. Thus, transistor 650 is configured to be a DC cut device that is coupled to be switched in response to the third stage output signal 3rd_out 668 in accordance with the teachings of the present invention.

As shown, transistor 646, transistor 648, and transistor 650 are coupled between the supply voltage AVDD and the reference voltage. Storage capacitor $C_S$ is coupled between the reference voltage and the gate of transistor 648. In the example, storage capacitor $C_S$ is configured to sample and hold a bias voltage Vbias that is coupled to bias the gate of transistor 648.

One difference between the example comparator illustrated in FIG. 6A and the example comparator illustrated in FIG. 5A is that transistor 652 in FIG. 6A is coupled between the storage capacitor $C_S$ and an externally provided 2nd stage bias signal vbias_2nd 698. As such, the externally provided 2nd stage bias signal vbias_2nd 698 is coupled to be sampled and held in storage capacitor $C_S$ in response to a second stage reset signal rst_2nd 656 instead of from the drain of transistor 648. As will be illustrated in greater detail below, the second stage 622 therefore does not need to consume current in order to sample and hold a bias voltage into storage capacitor $C_S$.

In operation, a second stage current of the second stage 622 is conducted through transistor 646, transistor 648, and transistor 650. As will be discussed in greater detail below, transistor 650 is a DC cut device as it is switched off in response to third stage output signal 3rd_out 668, which cuts off the second stage current of second stage 622 in response to third stage output signal 3rd_out 668. Thus, the second stage current of second stage 622 is substantially zero before and after switching transitions of the transistor 646 and transistor 650 in accordance with the teachings of the present invention.

The example depicted in FIG. 6A illustrates that the third stage 624 includes transistor 658, transistor 660, transistor 662, transistor 664 and buffer 666. Transistor 658 and transistor 664 are coupled to the supply voltage DVDD. Transistor 660 is coupled to transistor 658, and transistor 662 is coupled between transistor 660 and the reference voltage. Buffer 666 has an input that is coupled to a node between transistor 658 and transistor 660. The third stage output signal 3rd_out 668 is generated at the node between transistor 658 and transistor 660. Buffer 666 is coupled between rails provided by the supply voltage DVDD and the reference voltage. The output of buffer 666 is the output voltage of the comparator Vout 616. The gate of transistor 658 and the gate of transistor 660 are coupled to receive and be responsive to the second stage output signal 2nd_out 654. The gate of transistor 662 and the gate of transistor 664 are coupled to receive and be responsive to a third stage enable signal 3rd_en 670.

Figure 6B:
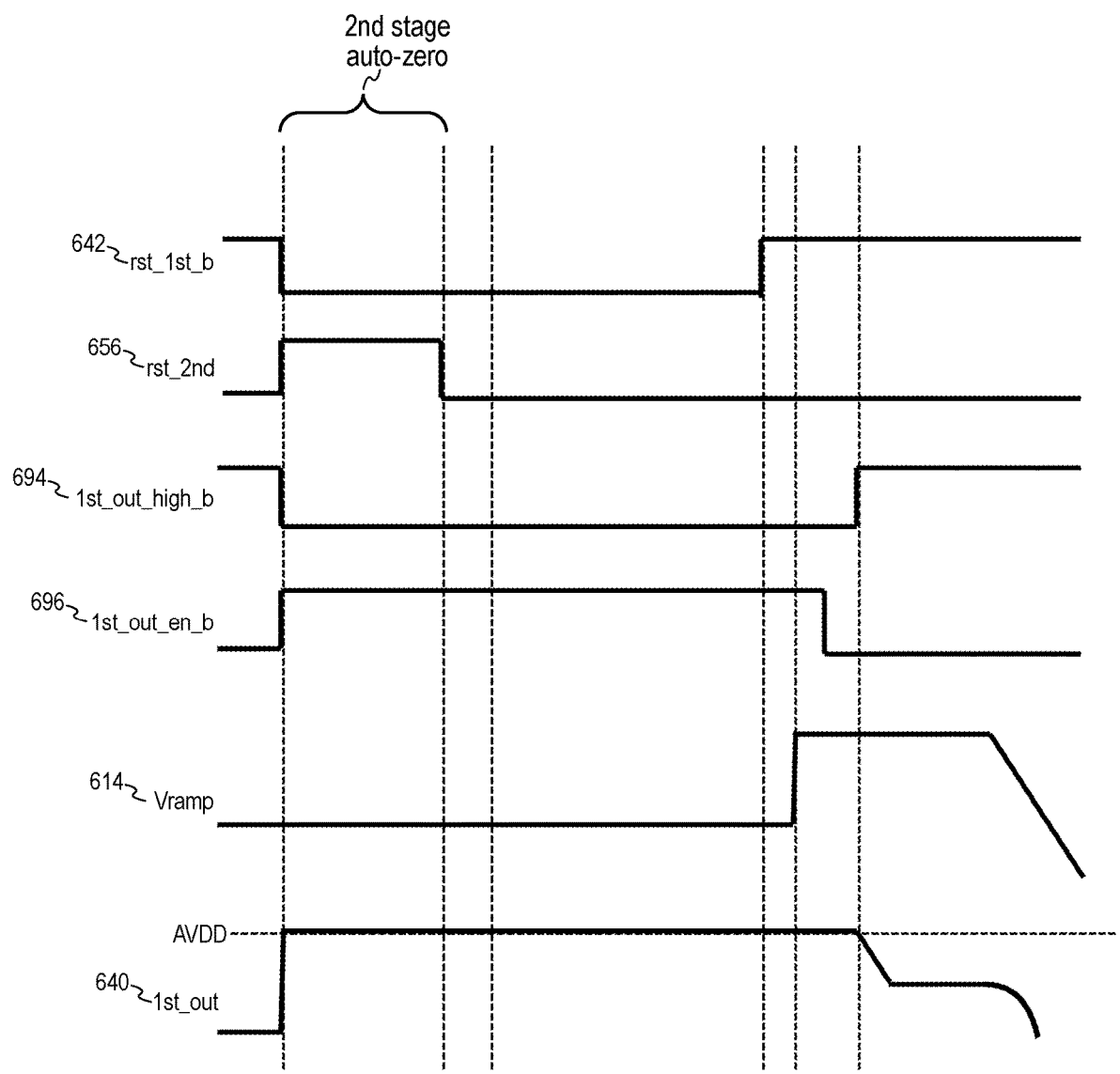
FIG. 6B is a timing diagram that illustrates some of the signals associated with a comparator as illustrated in FIG. 6A during an auto-zero period and during an analog to digital conversion in an image sensor in accordance with the teachings of the present invention.

FIG. 6B is a timing diagram that illustrates some of the signals associated with a comparator as illustrated in FIG. 6A during an auto-zero period and during analog to digital conversion in an image sensor in accordance with the teachings of the present invention. In particular, FIG. 6B shows an example of first stage reset signal rst_1st_b 642, second stage reset signal rst_2nd 656, first stage output high signal 1st_out_high_b 694, first stage output enable signal 1st_out_en_b 696, ramp signal Vramp 614, and first stage output signal 1st_out 640.

As shown in the depicted example, the first stage reset signal rst_1st_b 642 transitions to a logic low level and the second stage reset signal rst_2nd 656 transitions to a logic high level at the first vertical dashed line in FIG. 6B. Thus, at this time, transistors 636 and 638 are turned on to auto-zero the first stage 620, and transistor 652 is turned on to reset the second stage 622 and sample and hold the bias voltage value from the externally provided 2nd stage bias signal vbias_2nd 698 into the storage capacitor $C_S$ at the gate of transistor 648.

One difference between the example timing diagram illustrated in FIG. 6B and the example timing diagram illustrated in FIG. 5B is that the first stage output high signal 1st_out_high_b 694 is at a logic low level and that the first stage output enable signal 1st_out_en_b 696 is at a logic high level so that transistor 690 is turned on and transistor 692 is turned off at the first vertical dashed line. As such, the first stage output signal 1st_out 640 is pulled high to AVDD, which turns off transistor 646. Therefore, the second stage 622 does not consume current during the 2nd stage auto-zero period while the rst_2nd 656 is at a logic high enabling the externally provided 2nd stage bias signal vbias_2nd 698 to be sampled and held into the storage capacitor $C_S$. Then, at the second vertical dashed line after the bias voltage has been sampled and held into the storage capacitor $C_S$, the second stage reset signal rst_2nd 656 transitions to a logic low level, which turns off transistor 652.

Continuing with the example depicted in FIG. 6B and similar to the example depicted in FIG. 5B, first stage reset signal rst_1st_b 642 in FIG. 6B transitions to a logic high level at the fourth vertical dashed line, at which time transistors 636 and 638 are turned off to complete the auto-zero period of the first stage 620. The ramp signal Vramp 614 rises at the fifth vertical dashed line in preparation for the ADC operation. Afterwards, the first stage output enable signal 1st_out_en_b 696 transitions to the low logic level and the first stage output high signal 1st_out_high_b 694 transitions to the logic high level so that transistor 690 is turned off and transistor 692 is turned on at the sixth vertical dashed line. Thus, the second stage is now enabled to be responsive to the first stage output signal 1st_out 640 from the first stage 620, which enables the ADC operation to occur with the comparator as the ramp signal Vramp 614 ramps down after the sixth vertical dashed line.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A comparator including a second stage coupled between a first stage and a third stage, wherein the second stage comprises:
a first transistor coupled to be responsive to a first output signal coupled to be received from the first stage, wherein the first transistor is coupled generate a second output signal coupled to be received by the third stage; and
a second transistor coupled to the first transistor, wherein the first and second transistors are coupled between a first supply voltage and a reference voltage, wherein a second stage current of the second stage is conducted through the first transistor and the second transistor, wherein the second transistor is coupled to be switched in response to a third output signal coupled to be received from the third stage in response to the second output signal.

2. The comparator of claim 1, wherein the second stage current is substantially zero before and after switching transitions of the first and second transistors.

3. The comparator of claim 1, wherein the second stage further comprises a third transistor coupled between the first transistor and the second transistor, wherein the second stage current is conducted through the first transistor, the second transistor, and the third transistor.

4. The comparator of claim 3, wherein the second stage further comprises:
a storage capacitor coupled between a gate of the third transistor and the reference voltage; and
a fourth transistor coupled between the storage capacitor and a second stage bias voltage, wherein the fourth transistor is coupled to be switched in response to a second stage reset signal.

5. The comparator of claim 4, wherein the fourth transistor is coupled between the storage capacitor and a drain of the third transistor, wherein the drain of the third transistor is coupled to provide the second stage bias voltage.

6. The comparator of claim 1, wherein the third stage comprises:
a fifth transistor; and
a sixth transistor coupled to the fifth transistor, wherein the fifth and sixth transistors are coupled between a second supply voltage and the reference voltage, wherein the fifth and sixth transistors are coupled to be responsive to the second output signal, wherein the fifth and sixth transistors are coupled to generate the third output signal at a node between the fifth and sixth transistors.

7. The comparator of claim 6, wherein the third stage further comprises:
a seventh transistor coupled between the sixth transistor and the reference voltage;
an eighth transistor coupled between the second supply voltage and the node between the fifth and sixth transistors, wherein the seventh and eight transistors are coupled to be switched in response to a third stage enable signal; and
a buffer coupled to the node between the fifth and sixth transistors to generate an output voltage of the comparator.

8. The comparator of claim 6, wherein the third stage further comprises:
a seventh transistor coupled between the sixth transistor and the reference voltage, wherein the seventh transistor is coupled to be switched in response to a third stage enable signal;
a first NAND gate having a first input and a second input, wherein the first input of the first NAND gate is coupled to the node between the fifth and sixth transistors, wherein the second input of the second NAND gate is coupled to receive the third stage enable signal;
a second NAND gate having a first input and second input, wherein the first input of the second NAND gate is coupled to receive a complement of the third output signal from an output of the first NAND gate in response to the third stage enable signal, wherein the second input of the second NAND gate is coupled to receive a feedback enable signal, wherein the second transistor is coupled to be switched in response to the third output signal coupled to be received from an output of the second NAND gate in response to the feedback enable signal.

9. The comparator of claim 8, wherein the third stage further comprises an inverter coupled to receive the complement of the third output signal from the output of the first NAND gate in response to the third stage enable signal to generate an output voltage of the comparator.

10. The comparator of claim 8, wherein the third stage further comprises a ninth transistor coupled between the second supply voltage and the fifth transistor, wherein the ninth transistor is coupled to be switched in response to a complement of the third stage enable signal.

11. The comparator of claim 1, further comprising:
a tenth transistor coupled between the first supply voltage and a gate of the first transistor, wherein the tenth transistor is coupled to be switched in response to a first stage output high signal; and
an eleventh transistor coupled between the first stage and the gate of the first transistor, wherein the first transistor is coupled to receive the first output signal through the eleventh transistor in response to a first stage output enable signal.

12. The comparator of claim 1, wherein the first stage comprises:
a twelfth transistor coupled to the first supply voltage;
a thirteenth transistor coupled to the first supply voltage, wherein a gate and drain of the twelfth transistor are coupled to a gate of the thirteenth transistor;
a fourteenth transistor coupled to the twelfth transistor, wherein a gate of the fourteenth transistor is coupled to a first input of the comparator;
a fifteenth transistor coupled to the thirteenth transistor, wherein a gate of the fifteenth transistor is coupled to a second input of the comparator, wherein a node between the thirteenth and fifteenth transistors is coupled to generate the first output signal; and
a sixteenth transistor coupled to a node coupled to the fourteenth and fifteenth transistors, wherein the sixteenth transistors is coupled between the node coupled to the fourteenth and fifteenth transistors and the reference voltage, wherein the sixteenth transistor has a gate coupled tone biased with a first stage bias voltage.

13. The comparator of claim 12, wherein the first stage further comprises:
a first auto-zero transistor coupled between a drain and the gate of the fourteenth transistor; and
a second auto-zero transistor coupled between a drain and the gate of the fifteenth transistor, wherein the first and second auto-zero transistors are coupled to be switched in response to a first stage reset signal.

14. The comparator of claim 12,
wherein the first input of the comparator is coupled to receive a ramp signal from a ramp generator,
wherein the second input of the comparator is coupled to receive a bitline signal from a pixel array.

15. An imaging system, comprising:
an array of pixels to receive image light and generate image charge voltage signals in response; and
readout circuitry coupled to the receive the image charge voltage signals from the array of pixels through a plurality of bitlines, and provide a digital representation of a bitline signal from each of the plurality of bitlines in response, the readout circuitry including a comparator to receive the bitline signal, compare the bitline signal to a ramp signal from a ramp generator, and provide a comparator output voltage to a counter to generate the digital representation in response, wherein the comparator includes a second stage coupled between a first stage and a third stage, wherein the second stage comprises:
a first transistor coupled to be responsive to a first output signal coupled to be received from the first stage, wherein the first transistor is coupled generate a second output signal coupled to be received by the third stage; and
a second transistor coupled to the first transistor, wherein the first and second transistors are coupled between a first supply voltage and a reference voltage, wherein a second stage current of the second stage is conducted through the first transistor and the second transistor, wherein the second transistor is coupled to be switched in response to a third output signal coupled to be received from the third stage in response to the second output signal.

16. The imaging system of claim 15, wherein the second stage current is substantially zero before and after switching transitions of the first and second transistors.

17. The imaging system of claim 15, wherein the second stage further comprises a third transistor coupled between the first transistor and the second transistor, wherein the second stage current is conducted through the first transistor, the second transistor, and the third transistor.

18. The imaging system of claim 17, wherein the second stage further comprises:
a storage capacitor coupled between a gate of the third transistor and the reference voltage; and
a fourth transistor coupled between the storage capacitor and a second stage bias voltage, wherein the fourth transistor is coupled to be switched in response to a second stage reset signal.

19. The imaging system of claim 18, wherein the fourth transistor is coupled between the storage capacitor and a drain of the third transistor, wherein the drain of the third transistor is coupled to provide the second stage bias voltage.

20. The imaging system of claim 15, wherein the third stage comprises:
a fifth transistor; and
a sixth transistor coupled to the fifth transistor, wherein the fifth and sixth transistors are coupled between a second supply voltage and the reference voltage, wherein the fifth and sixth transistors are coupled to be responsive to the second output signal, wherein the fifth and sixth transistors are coupled to generate the third output signal at a node between the fifth and sixth transistors.

21. The imaging system of claim 20, wherein the third stage further comprises:
a seventh transistor coupled between the sixth transistor and the reference voltage;
an eighth transistor coupled between the second supply voltage and the node between the fifth and sixth transistors, wherein the seventh and eight transistors are coupled to be switched in response to a third stage enable signal; and
a buffer coupled to the node between the fifth and sixth transistors to generate an output voltage of the comparator.

22. The imaging system of claim 20, wherein the third stage further comprises:
- a seventh transistor coupled between the sixth transistor and the reference voltage, wherein the seventh transistor is coupled to be switched in response to a third stage enable signal;
- a first NAND gate having a first input and a second input, wherein the first input of the first NAND gate is coupled to the node between the fifth and sixth transistors, wherein the second input of the second NAND gate is coupled to receive the third stage enable signal;
- a second NAND gate having a first input and second input, wherein the first input of the second NAND gate is coupled to receive a complement of the third output signal from an output of the first NAND gate in response to the third stage enable signal, wherein the second input of the second NAND gate is coupled to receive a feedback enable signal, wherein the second transistor is coupled to be switched in response to the third output signal coupled to be received from an output of the second NAND gate in response to the feedback enable signal.

23. The imaging system of claim 22, wherein the third stage further comprises an inverter coupled to receive the complement of the third output signal from the output of the first NAND gate in response to the third stage enable signal to generate an output voltage of the comparator.

24. The imaging system of claim 22, wherein the third stage further comprises a ninth transistor coupled between the second supply voltage and the fifth transistor, wherein the ninth transistor is coupled to be switched in response to a complement of the third stage enable signal.

25. The imaging system of claim 15, further comprising:
- a tenth transistor coupled between the first supply voltage and a gate of the first transistor, wherein the tenth transistor is coupled to be switched in response to a first stage output high signal; and
- an eleventh transistor coupled between the first stage and the gate of the first transistor, wherein the first transistor is coupled to receive the first output signal through the eleventh transistor in response to a first stage output enable signal.

26. The imaging system of claim 15, wherein the first stage comprises:
- a twelfth transistor coupled to the first supply voltage;
- a thirteenth transistor coupled to the first supply voltage, wherein a gate and drain of the twelfth transistor are coupled to a gate of the thirteenth transistor;
- a fourteenth transistor coupled to the twelfth transistor, wherein a gate of the fourteenth transistor is coupled to a first input of the comparator;
- a fifteenth transistor coupled to the thirteenth transistor, wherein a gate of the fifteenth transistor is coupled to a second input of the comparator, wherein a node between the thirteenth and fifteenth transistors is coupled to generate the first output signal; and
- a sixteenth transistor coupled to a node coupled to the fourteenth and fifteenth transistors, wherein the sixteenth transistors is coupled between the node coupled to the fourteenth and fifteenth transistors and the reference voltage, wherein the sixteenth transistor has a gate coupled tone biased with a first stage bias voltage.

27. The imaging system of claim 26, wherein the first stage further comprises:
- a first auto-zero transistor coupled between a drain and the gate of the fourteenth transistor; and
- a second auto-zero transistor coupled between a drain and the gate of the fifteenth transistor, wherein the first and second auto-zero transistors are coupled to be switched in response to a first stage reset signal.

28. The imaging system of claim 26,
wherein the first input of the comparator is coupled to receive a ramp signal from a ramp generator,
wherein the second input of the comparator is coupled to receive a bitline signal from a pixel array.

* * * * *

UNITED STATES PATENT AND TRADEMARK OFFICE
CERTIFICATE OF CORRECTION

| | |
|---|---|
| PATENT NO. | : 11,206,039 B1 |
| APPLICATION NO. | : 17/127499 |
| DATED | : December 21, 2021 |
| INVENTOR(S) | : Hiroaki Ebihara |

It is certified that error appears in the above-identified patent and that said Letters Patent is hereby corrected as shown below:

In the Claims

In Column 17, Line 60, before "generate" insert -- to --.
In Column 18, Line 43, delete "eight" and insert -- eighth --.
In Column 19, Line 60, before "receive" delete "the".
In Column 20, Line 8, before "generate" insert -- to --.
In Column 20, Line 62, delete "eight" and insert -- eighth --.

Signed and Sealed this
Ninth Day of August, 2022

Katherine Kelly Vidal
*Director of the United States Patent and Trademark Office*